US009599655B2

(12) United States Patent
Nakamura

(10) Patent No.: US 9,599,655 B2
(45) Date of Patent: Mar. 21, 2017

(54) SEMICONDUCTOR DEVICE

(71) Applicant: Mitsubishi Electric Corporation, Tokyo (JP)

(72) Inventor: Hiroyuki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 307 days.

(21) Appl. No.: 14/245,284

(22) Filed: Apr. 4, 2014

(65) Prior Publication Data

US 2015/0042373 A1 Feb. 12, 2015

(30) Foreign Application Priority Data

Aug. 9, 2013 (JP) .................................. 2013-165997

(51) Int. Cl.
G01R 31/02 (2006.01)
G01R 31/26 (2014.01)
G01R 19/00 (2006.01)
G01R 31/04 (2006.01)
(Continued)

(52) U.S. Cl.
CPC ....... G01R 31/041 (2013.01); G01R 19/0092 (2013.01); H01L 23/495 (2013.01);
(Continued)

(58) Field of Classification Search
CPC G01R 1/0491; G01R 31/265; G01R 31/3012; G01R 31/318511; G01R 15/12;
(Continued)

(56) References Cited

U.S. PATENT DOCUMENTS 5,703,399 A 12/1997 Majumdar et al.
6,410,365 B1 * 6/2002 Kawata ................. H01L 21/565
438/123
(Continued)

FOREIGN PATENT DOCUMENTS

JP 05-190748 A 7/1993
JP 09-139461 A 5/1997
(Continued)

OTHER PUBLICATIONS

An Office Action issued by the Chinese Patent Office on Oct. 14, 2016, which corresponds to Chinese Patent Application No. 201410389342.7 and is related to U.S. Appl. No. 14/245,284; with English language partial translation.

Primary Examiner — Huy Q Phan
Assistant Examiner — Raul Rios Russon
(74) Attorney, Agent, or Firm — Studebaker & Brackett PC

(57) ABSTRACT

A semiconductor device capable of simplifying wiring work is provided. A semiconductor device includes a semiconductor element (insulated gate bipolar transistor IGBT) provided with an emitter main electrode and an emitter sense electrode, an integrated circuit having a detection terminal and a mold resin body that seals the semiconductor element and the integrated circuit, and a lead. The lead is provided with an inner lead part sealed in the mold resin body and electrically connected to the emitter sense electrode, an inner lead part sealed in the mold resin body and electrically connected to the emitter main electrode, and an outer lead part connected to the lead part on one side, connected to the inner lead part on the other side and exposed outside the mold resin body.

15 Claims, 10 Drawing Sheets

(51) Int. Cl.
*H01L 23/495* (2006.01)
*G01R 1/04* (2006.01)
*G01R 31/265* (2006.01)
*G01R 21/06* (2006.01)

(52) U.S. Cl.
CPC .. *H01L 23/49562* (2013.01); *H01L 23/49575* (2013.01); *G01R 1/0491* (2013.01); *G01R 21/06* (2013.01); *G01R 31/261* (2013.01); *G01R 31/265* (2013.01); *G01R 31/2623* (2013.01); *H01L 2224/48137* (2013.01); *H01L 2224/48139* (2013.01); *H01L 2224/48247* (2013.01); *H01L 2224/49111* (2013.01); *H01L 2924/13055* (2013.01)

(58) Field of Classification Search
CPC ...... G01R 15/144; G01R 19/00; G01R 19/30; G01R 21/06; G01R 31/261; G01R 31/2623
USPC ......... 324/71, 378, 403, 415, 425, 500, 537, 324/762.01, 762.03, 76.11–76.83
See application file for complete search history.

(56) References Cited

U.S. PATENT DOCUMENTS

| | | | | |
|---|---|---|---|---|
| 2001/0028107 | A1* | 10/2001 | Wada | H01L 21/565 257/724 |
| 2002/0017722 | A1* | 2/2002 | Masuda | H01L 23/4951 257/724 |
| 2002/0190374 | A1* | 12/2002 | Nakajima | H01L 21/565 257/707 |
| 2007/0001275 | A1* | 1/2007 | Shirasaka | H01L 21/565 257/666 |
| 2010/0007026 | A1* | 1/2010 | Shikano | H01L 24/49 257/773 |
| 2012/0319275 | A1* | 12/2012 | Fukuda | H01L 21/561 257/738 |

FOREIGN PATENT DOCUMENTS

JP 2004-048084 A 2/2004
JP 2013-055739 A 3/2013

* cited by examiner

CURRENT SENSE

MAIN CURRENT DETECTION

SEMICONDUCTOR DEVICE

BACKGROUND OF THE INVENTION

Field of the Invention

The present invention relates to a semiconductor device.

Background Art

Conventionally, as is disclosed in Japanese Patent Laid-Open No. 9-139461, a semiconductor device is known, which has an appearance with a plurality of leads extending in parallel on one side of a mold resin body. This type of appearance is adopted among common integrated circuits. Manufacturing steps thereof generally include die bonding and wire bonding of a semiconductor chip on a lead frame, sealing of the lead frame with mold resin and then lead cutting whereby the lead frame is cut.

Semiconductor elements provided with a current sense function are well known and power semiconductor modules incorporating such semiconductor elements are becoming widespread. There is also a scheme that detects a current by detecting a main current instead of using a current sense function. A technique is also known which provides these two current detection functions in one power semiconductor module. With this type of power semiconductor module, a user can select and use one of the two current detection functions.

The power semiconductor module is mounted on a mounting substrate and used as a component together with other parts for various electric circuits such as an inverter circuit. Given the above-described alternative of the current detection scheme, a user must prepare a mounting substrate suitable for the user selected current detection scheme.

More specifically, using the current sense function requires a mounting substrate to be prepared in which a sense resistor is arranged at an appropriate position. Furthermore, detecting a main current requires a mounting substrate to be prepared in which a shunt resistor is arranged at an appropriate position.

Although the above-described power semiconductor module increases the range of alternatives for the user to choose a current detection scheme, the user is required to design and prepare an appropriate mounting substrate. Therefore, there is still room for improvement from the standpoint of user convenience.

Moreover, when the above-described alternative of the current detection scheme is given, the burden of wiring work that should be done by the user increases. As a result, miswiring may occur. Focusing on this problem, the present inventor came to discover a semiconductor device capable of detecting miswiring.

SUMMARY OF THE INVENTION

The present invention has been implemented to solve the above-described problems and it is an object of the present invention to improve user convenience in wiring work using a semiconductor device that allows a user to choose a current detection scheme.

It is another object of the present invention to detect miswiring in a semiconductor device that allows a user to choose a current detection scheme.

According to a first aspect of the present invention, a semiconductor device includes: a semiconductor element provided with a main electrode and a current detection electrode; an integrated circuit having a detection terminal; a mold resin body that seals the semiconductor element and the integrated circuit; and a lead provided with a first inner lead part, a second inner lead part, and an outer lead part. The first inner lead part is electrically connected to the current detection electrode sealed in the mold resin body. The second inner lead part is sealed in the mold resin body and electrically connected to the main electrode. The outer lead part is connected to the first inner lead part on one side, and the outer lead part is connected to the second inner lead part on the other side. The outer lead part is exposed outside the mold resin body.

According to a second aspect of the present invention, a semiconductor device includes: a semiconductor element provided with a main electrode and a current detection electrode; an integrated circuit having a detection terminal and a reference potential terminal; a mold resin body that seals the semiconductor element and the integrated circuit; and a lead provided with a first inner lead part, a second inner lead part, and an outer lead part. The first inner lead part is electrically connected to the current detection electrode sealed in the mold resin body. The second inner lead part is sealed in the mold resin body and electrically connected to the reference potential terminal. The outer lead part is connected to the first inner lead part on one side, and the outer lead part is connected to the second inner lead part on the other side. The outer lead part is exposed outside the mold resin body.

According to a third aspect of the present invention, a semiconductor device includes: a semiconductor element provided with a main electrode and a current detection electrode; an integrated circuit having a detection terminal and a reference potential terminal; a mold resin body that seals the semiconductor element and the integrated circuit; and a lead partially sealed with the mold resin body, that electrically connects the current detection electrode, the reference potential terminal and the main electrode. The lead includes: a first inner lead part electrically connected to the current detection electrode sealed in the mold resin body; a second inner lead part electrically connected to the reference potential terminal sealed in the mold resin body; a third inner lead part sealed in the mold resin body and electrically connected to the main electrode; and an outer lead part that has a first branch part connected to the first inner lead part, a second branch part connected to the second inner lead part and a third branch part connected to the third inner lead part. The outer lead part is exposed outside the mold resin body.

According to a fourth aspect of the present invention, a semiconductor device includes: a semiconductor element provided with a main electrode and a current detection electrode; a main electrode terminal electrically connected to the main electrode; a detection electrode terminal electrically connected to the current detection electrode; and an integrated circuit. The integrated circuit has a voltage detection terminal for performing alternative voltage detection on the main electrode and the current detection electrode. The integrated circuit determines, when the voltage inputted to the voltage detection terminal exceeds a first threshold, that an overcurrent abnormality occurs. The integrated circuit determines, when the voltage inputted to the voltage detection terminal falls below a second threshold which is smaller than the first threshold, that miswiring occurs.

Other and further objects, features and advantages of the invention will appear more fully from the following description.

DETAILED DESCRIPTION OF THE PREFERRED EMBODIMENTS

First Embodiment

Structure of Apparatus of First Embodiment

Figure 1:
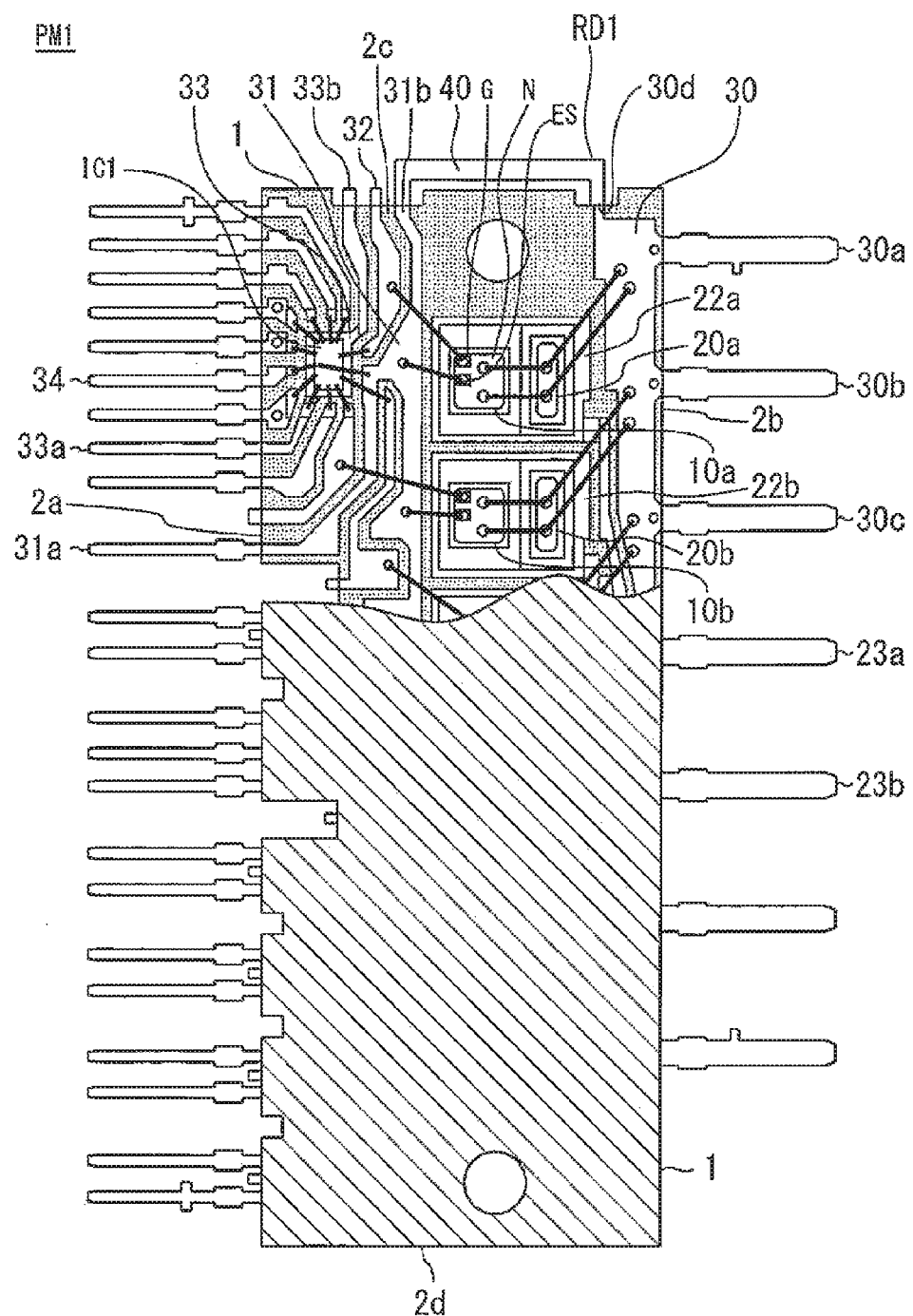
FIGS. 1 and 2 illustrate a semiconductor device according to a first embodiment of the present invention.
Figure 2:
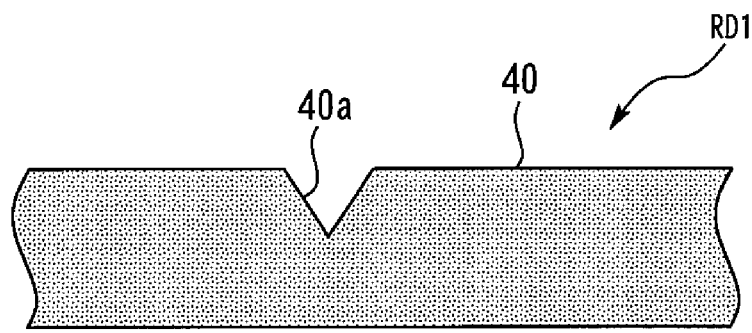
Figure 3:
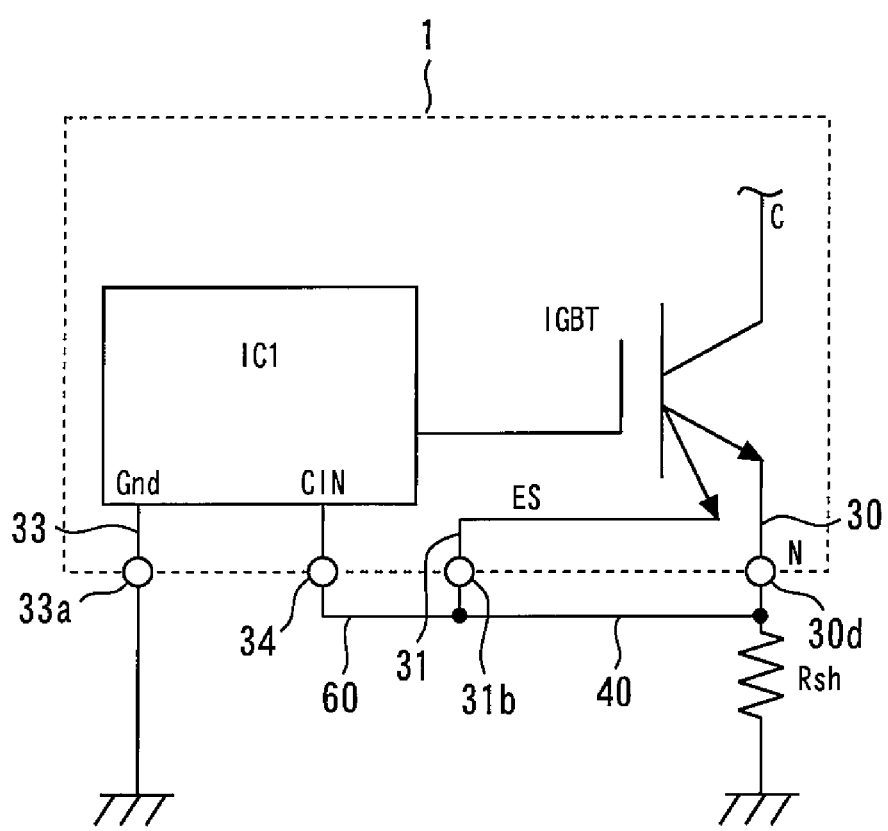
FIG. 3 illustrates a circuit of a semiconductor device according to the first embodiment of the present invention.

FIGS. 1 to 3 illustrate a semiconductor device PM1 according to a first embodiment of the present invention. FIG. 1 is a plan view of the semiconductor device PM1, showing a perspective view of part of an inner structure thereof.

The semiconductor device PM1 has an appearance with a plurality of leads extending in parallel on both sides of a mold resin body. This type of appearance is employed for common integrated circuits.

Manufacturing steps thereof generally provide a flow of die bonding and wire bonding of a semiconductor chip on a lead frame, sealing with mold resin and cutting of the lead frame to divide it into separate leads.

The semiconductor device PM1 supports both a current detection scheme using a current sense function and a current detection scheme detecting a main current. One semiconductor device PM1 can support these two current detection schemes and allows a user to choose one of the two current detection schemes.

The semiconductor device PM1 is provided with semiconductor elements 10a and 10b. The semiconductor elements 10a and 10b are insulated gate bipolar transistors (IGBT). The semiconductor element 10a is provided with a gate electrode G to which a control signal is inputted, a collector main electrode C and an emitter main electrode N both which are main electrodes. The semiconductor element 10a is further provided with an emitter sense electrode ES. Although detailed illustration is omitted, in FIG. 1, these electrodes provided on the surface of the semiconductor element 10a are insulated from each other.

The emitter sense electrode ES is an electrode through which a sense current flows, which is partially branched from a main current flowing between the emitter and collector. It is possible to realize current sensing of the semiconductor element 10a via the emitter sense electrode ES. However, the present invention is not limited to this, and the present invention may also be applicable to other semiconductor elements except for IGBTs provided with current sensing functions.

Note that FIG. 1 also illustrates free-wheel diode elements 20a and 20b for convenience, and the semiconductor elements 10a and 10b are connected to the free-wheel diode elements 20a and 20b via bonding wires. This type of electrical connection structure is already known and not a new item, and therefore detailed description thereof is omitted.

Note that another semiconductor element is also provided in the part covered with the surface of a mold resin body 1 in FIG. 1 (hidden part).

An integrated circuit IC1 includes a ground terminal GND to be connected to a ground potential which is a reference potential and a detection terminal CIN.

The mold resin body 1 seals the semiconductor elements 10a and 10b, and the integrated circuit IC1. The mold resin body 1 is provided with two opposing main surfaces (specifically, a front surface of the sheet and a back surface of the sheet in FIG. 1) and four sides 2a, 2b, 2c and 2d connecting the two main surfaces. Of the four sides, a plurality of other leads electrically connecting the semiconductor elements 10a and 10b, and the integrated circuit IC1 protrude in parallel from the side 2a and the side 2b facing the side 2a.

The semiconductor device PM1 is internally provided with a plurality of leads. The respective leads are provided with an inner lead part sealed with the mold resin body 1 and an outer lead part extending outside the mold resin body 1. In each lead, the surface of the inner lead part is connected to the respective electrodes of the semiconductor elements 10a and 10b or the respective electrodes of the integrated circuit IC1 via bonding wires, playing a role as an electric circuit wire of the semiconductor apparatus PM1.

As shown in FIG. 1, the semiconductor device PM1 is provided with die pads 22a and 22b. The semiconductor elements 10a and 10b, and the free-wheel diode elements 20a and 20b are die-bonded on the die pads 22a and 22b. The die pad 22a is integrally connected to a lead 23a, the die pad 22b is integrally connected to a lead 23b, and the leads 23a and 23b extend outside the mold resin body 1.

The semiconductor device PM1 is provided with leads 32, 33 and 34. The semiconductor device PM1 is further provided with a lead RD1 which is one of technical features of the present embodiment.

The lead 32 is electrically connected with gate electrodes of the semiconductor elements 10a and 10b via a bonding wire. Furthermore, the lead 32 is electrically connected with a control signal terminal of the integrated circuit IC1 via the bonding wire. This allows a gate drive signal outputted from the integrated circuit IC1 to be supplied to the gate electrodes of the semiconductor elements 10a and 10b via the lead 32.

The lead 33 is provided with a die pad part to which the integrated circuit IC1 is die-bonded, and ends 33a and 33b that extend in a substantially opposite direction from this die pad part. The end 33a extends outside from the side 2a of the mold resin body 1. The end 33b is exposed outside from the side 2c of the mold resin body 1. This lead 33 is connected to the ground terminal of the integrated circuit IC1 via a bonding wire. The end 33a is a ground connection lead to be connected to a ground potential when the semiconductor device PM1 is mounted.

The lead 34 is electrically connected to the detection terminal CIN of the integrated circuit IC1 via a bonding wire. The lead 34 protrudes outward from the side 2a of the mold resin body 1. By configuring an electric circuit together with a sense resistor and a shunt resistor using the exposed end of this lead 34, the integrated circuit IC1 can perform current sensing as shown in FIG. 4 which will be described later.

The lead RD1 is provided with inner lead parts 30 and 31 sealed in the mold resin body 1, and an outer lead part 40 exposed outside the mold resin body 1. The outer lead part 40 connects the inner lead parts 30 and 31. The outer lead part 40 extends in a length direction of the side 2c on the side 2c.

The side 2c is a side different from the sides 2a and 2b from which many leads protrude in parallel. This allows the outer lead part 40 to avoid interference with a plurality of leads located on the sides 2a and 2b, making it possible to achieve the mounting of the semiconductor device PM1 on a conventional mounting substrate without trouble.

The inner lead part 30 is sealed in the mold resin body 1 and electrically connected to emitter main electrodes E of the semiconductor elements 10a and 10b via bonding wires. The inner lead part 30 is provided with a flat part to which two bonding wires are connected from the semiconductor elements 10a and 10b respectively, and three ends 30a, 30b and 30c that protrude from this flat part through the side 2b of the mold resin body 1.

The ends 30a, 30b and 30c are used as emitter electrode leads to be electrically connected to the emitters of the semiconductor elements 10a and 10b. The inner lead part 30 is further provided with an end 30d that extends toward the side 2c of the mold resin body 1. The end 30d is connected to the outer lead part 40.

The inner lead part 31 is sealed in the mold resin body 1 and electrically connected with the emitter sense electrodes ES of the semiconductor elements 10a and 10b via bonding wires. More specifically, the inner lead part 31 is provided with an end 31a to extract an emitter sense current for detection of an emitter sense current to outside the semiconductor device PM1.

Furthermore, the inner lead part 31 is provided with an end 31b that extends toward the side 2c of the mold resin body 1. The end 31b is connected to the outer lead part 40.

As described above, the outer lead part 40 is connected to the inner lead part 31 on one hand and connected to the inner lead part 30 on the other. The outer lead part 40 is exposed on the side 2c side of the mold resin body 1. As will be described later, the outer lead part 40 may be cut or may not be cut depending on the current detection scheme selected by the user. Cutting the outer lead part 40 makes it possible to mechanically and electrically divide the inner lead parts 30 and 31.

FIG. 2 illustrates the semiconductor device PM1 according to the first embodiment of the present invention. A notch 40a that extends in a short side direction of the outer lead part 40 is provided on the surface of the outer lead part 40. This facilitates cutting of the outer lead part 40.

Circuit of First Embodiment

FIG. 3 and FIG. 4 illustrate the semiconductor device PM1 according to the first embodiment of the present invention and illustrate part of the inner circuit of the semiconductor device PM1. Parts assigned the same reference numerals between the structural diagram shown in FIG. 1 and the circuit diagrams shown in FIG. 3 and FIG. 4 are associated with each other in a one-to-one correspondence.
(Main Current Detection Scheme)

FIG. 3 illustrates a circuit in the case of adopting a current detection scheme for detecting a main current when the semiconductor device PM1 is mounted. In this case, an external shunt resistor Rsh is provided for a mounting substrate (not shown) on which the semiconductor device PM1 is to be mounted. A wire 60 is formed for electrically connecting the end 31a and an end of the lead 34 on the mounting substrate side so as to connect the detection terminal CIN and the emitter sense electrode ES.

Here, when the scheme of detecting a main current is adopted, the outer lead part 40 is left uncut. One end of the shunt resistor Rsh is connected to the ground and the other end of the shunt resistor Rsh is electrically connected to the outer lead part 40. This allows the other end of the shunt resistor Rsh to be electrically connected to the emitter main electrode N and the detection terminal CIN via the outer lead part 40.
(Scheme Using Current Sense Function)

Figure 4A:
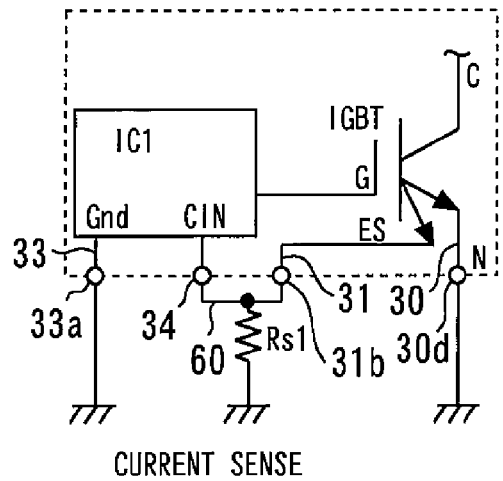
FIGS. 4A and 4B illustrate circuits of a semiconductor device according to the first embodiment of the present invention.
Figure 4B:
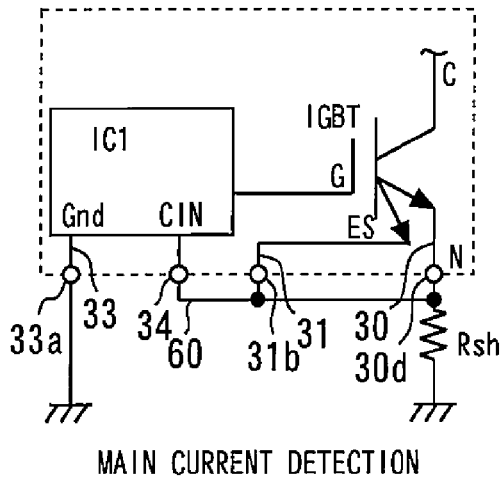

FIG. 4 illustrates a circuit adopting a current detection scheme of detecting a current-sense current using the current sense function of the semiconductor elements 10a and 10b when the semiconductor device PM1 is mounted. FIG. 4A illustrates a circuit for using a current sense function of the semiconductor device PM1 according to the first embodiment. For comparison, FIG. 4B also illustrates a circuit for using a main current detection function of the semiconductor device PM1, which is illustrated in FIG. 3. In this case, in the first embodiment, the external sense resistor Rs1 is provided for the mounting substrate (not shown) on which the semiconductor device PM1 is to be mounted.

In the case of FIG. 4 as well as FIG. 3, a wire is formed for electrically connecting the end 31a and the end of the lead 34 on the mounting substrate side so as to electrically connect the detection terminal CIN and the emitter sense electrode ES.

When the current sense function is used, the outer lead part 40 is cut. By so doing, as shown in FIG. 4, the emitter main electrode N is electrically cut from the detection terminal CIN. On the other hand, one end of the sense resistor Rs1 is connected to both the detection terminal CIN and the emitter sense electrode ES and the other end of the sense resistor Rs1 is connected to the ground.

As describe above, according to the first embodiment, in the semiconductor device PM1 for which one of a plurality of current detection schemes is selectable, the lead RD1 that connects parts to be electrically connected required for a specific current detection scheme is formed beforehand, and part thereof is exposed outside the mold resin body 1. The outer lead part 40 which is the exposed part of the lead RD1 may be left and used depending on the current detection scheme or may be cut if unnecessary. For this reason, the semiconductor device PM1 is provided which can simplify wiring work.

Miswiring Determining Function of Apparatus of First Embodiment

Figure 5:
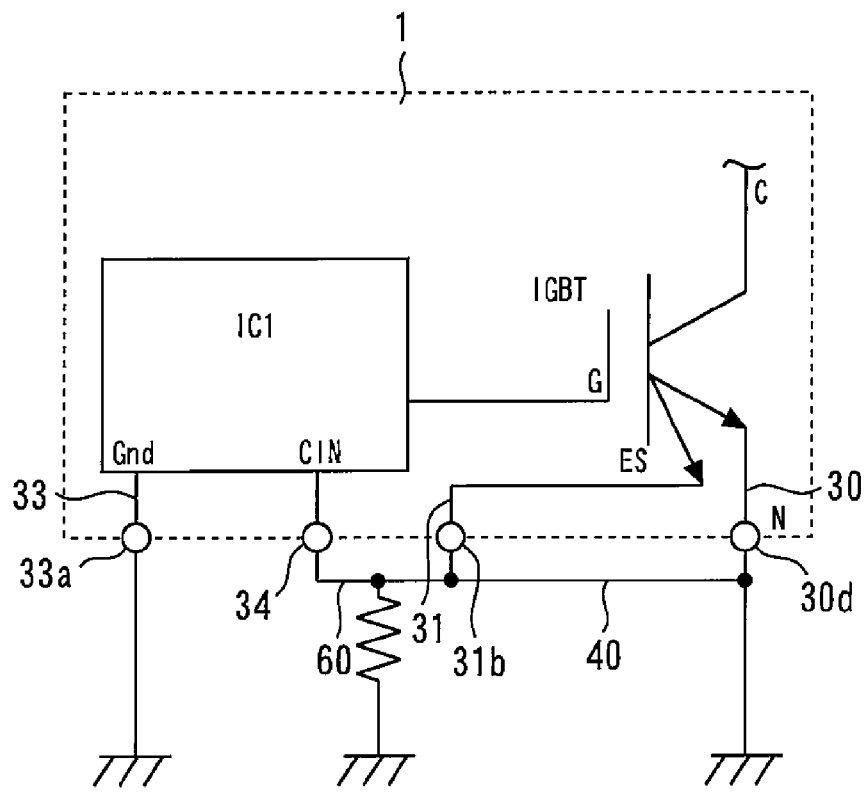
FIG. 5 is a diagram illustrating miswiring which may occur in the semiconductor device according to the first embodiment of the present invention.

FIG. 5 is a diagram illustrating miswiring which may occur in the semiconductor device PM1 according to the first embodiment of the present invention. The miswiring shown in FIG. 5 results from making a circuit connection under the current sense scheme shown in FIG. 4 with the outer lead part 40 left uncut.

In the first embodiment, the integrated circuit IC1 is mounted with the following miswiring determining function. The integrated circuit IC1 performs alternative voltage detection on the emitter main electrode N and the emitter sense electrode ES via the detection terminal CIN. The integrated circuit IC1 determines that an overcurrent abnormality has occurred when the voltage of the detection terminal CIN exceeds a first threshold Vth1, or determines that miswiring has occurred when the voltage of the detection terminal falls below a second threshold Vth2 which is smaller than the first threshold.

Grounds for this determination are as follows. First, if the correct circuit connection as shown in FIG. 4 has been made, the voltage of the sense resistor Rs1 changes according to the sense current from the emitter sense electrode ES.

The voltage of the sense resistor Rs1 is inputted to the detection terminal CIN and when this voltage is excessively large, the integrated circuit IC1 determines that an overcurrent is flowing through the semiconductor element 10a (IGBT). The above-described first threshold Vth1 is a threshold for determining this overcurrent. When an overcurrent is generated, the integrated circuit IC1 takes action such as adjusting a gate drive signal, stopping output of the semiconductor element 10a or reducing the current.

However, in the miswiring in FIG. 5, the detection terminal CIN is connected to the ground due to the presence of the outer lead part 40. For this reason, even when there is a sense current from the emitter sense electrode ES, the voltage of the sense resistor Rs1 does not change. Thus, the voltage of the detection terminal CIN becomes a ground potential and is kept to a voltage obviously lower than that in the case of the normal wiring in FIG. 4.

Thus, the present embodiment stores a second threshold Vth2 smaller than the first threshold Vth1 and determines that miswiring has occurred when the voltage of the detection terminal CIN is as low as below this second threshold Vth2.

The determination result may be broadcast by sending an error signal to outside the semiconductor device PM1 via one of other leads connected to the IC1. The integrated circuit IC1 may also be made to perform a predetermined protective operation.

Second Embodiment

Figure 6:
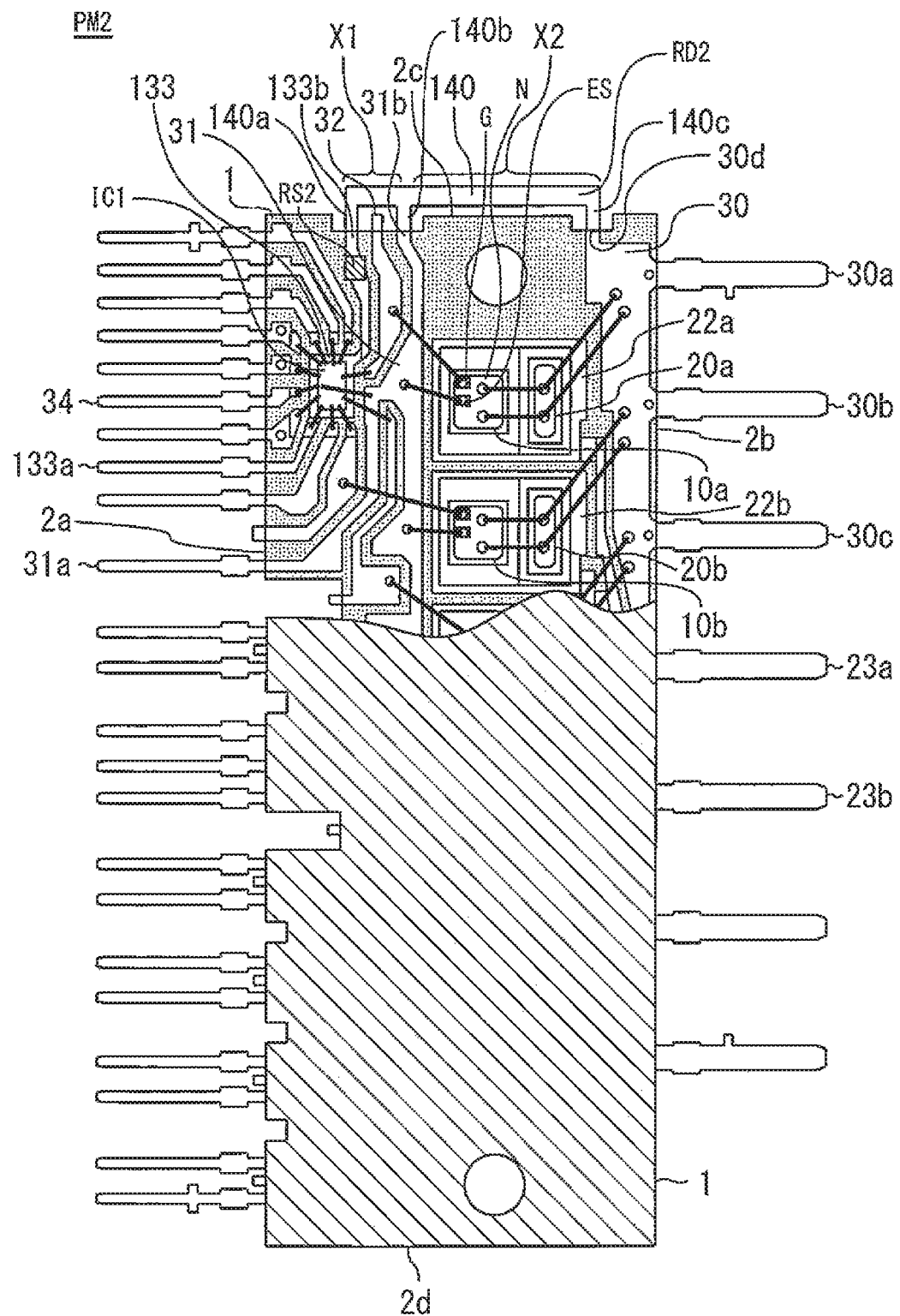
FIGS. 6 to 12 illustrate a semiconductor device according to a second embodiment of the present invention.
Figure 7:
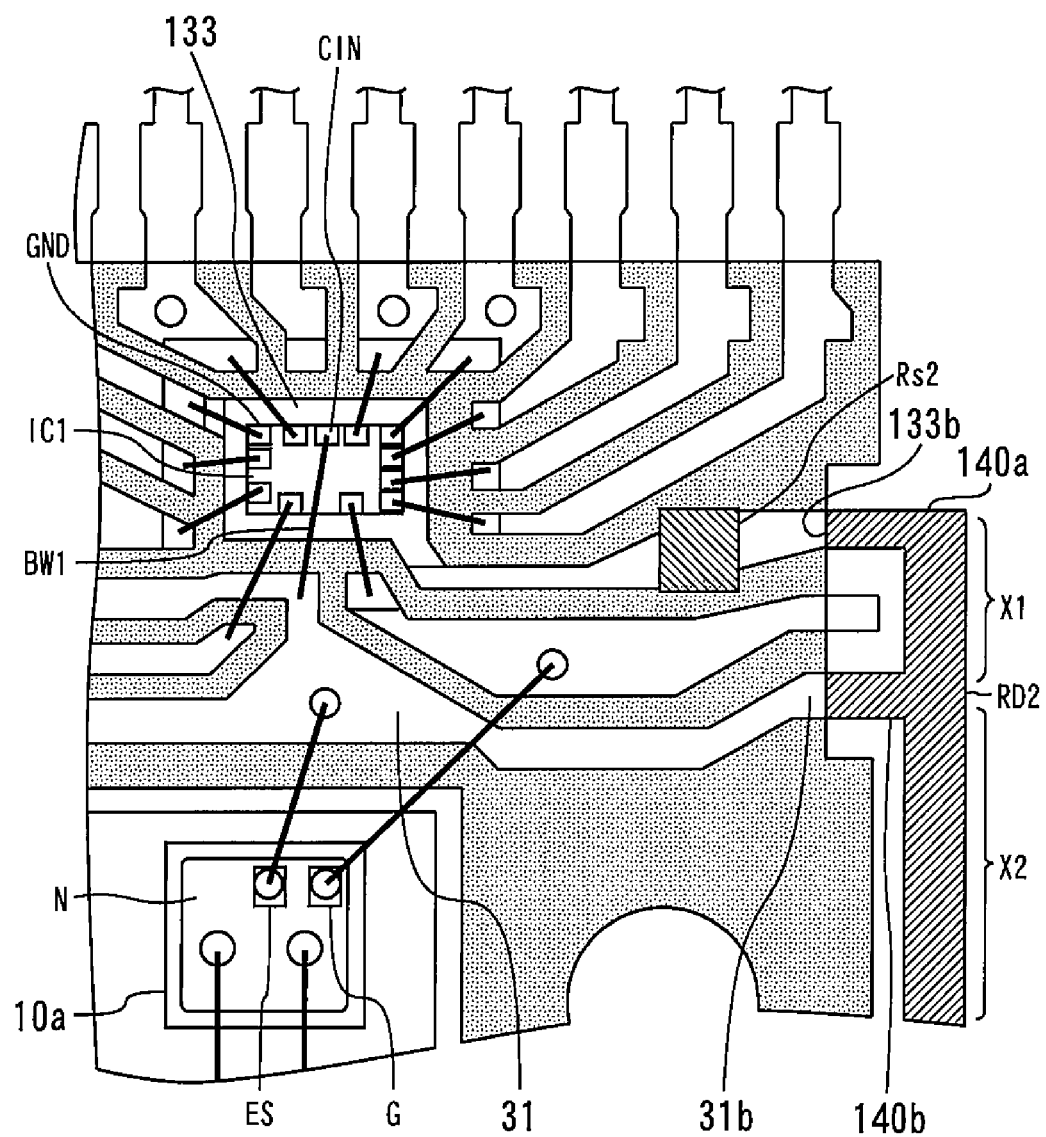

FIG. 6 and FIG. 7 illustrate a semiconductor device PM2 according to a second embodiment of the present invention. FIG. 6 has a format similar to that in FIG. 1 of the first embodiment, and is a plan view of the semiconductor device PM2, showing a perspective view of part of an inner structure thereof. FIG. 7 is an enlarged view of the periphery of the semiconductor element 10a and the integrated circuit IC1 in FIG. 6.

The semiconductor device PM2 has a configuration similar to that of the semiconductor device PM1 according to the first embodiment except in that a lead RD2 is provided instead of the lead RD1 and the lead 33, and the integrated circuit IC1 has a different bonding wire connection. Therefore, components identical or corresponding to those in the first embodiment will be described, assigned the same reference numerals and description will be focused on differences from the first embodiment and description of common items will be simplified or omitted.

The lead RD2 is provided with inner lead parts 30 and 31, an inner lead part 133 and an outer lead part 140. The inner lead part 30 is electrically connected to an emitter main electrode N sealed in a mold resin body 1. The inner lead part 31 is electrically connected with an emitter sense electrode ES sealed in the mold resin body 1. This aspect is the same as that in the first embodiment.

The inner lead part 133 is similar to the lead 33 in the first embodiment in that it is sealed in the mold resin body 1 and electrically connected with a reference potential terminal GND. However, the inner lead part 133 is part of the lead RD2 and connected to the inner lead parts 30 and 31 via the outer lead part 140. The inner lead part 133 is different from the lead 33 in this respect.

The inner lead part 133 is provided with ends 133a and 133b, and these correspond to the ends 33a and 33b of the lead 33. As will be described later, the end 133b of the inner lead part 133 is connected to a branch part 140a of the outer lead part 140.

The outer lead part 140 is branched into branch parts 140a, 140b and 140c. The branch part 140b is connected to the inner lead part 31. The branch part 140a is connected to the inner lead part 133. The branch part 140c is connected to the inner lead part 30. The outer lead part 140 is exposed outside on the side 2c side of the mold resin body 1.

The outer lead part 140 is divided into two sections: a wiring section X1 and a wiring section X2. The wiring section X1 refers to a section connecting from the branch part 140a to the branch part 140b. The wiring section X2 refers to a section connecting from the branch part 140b to the branch part 140c. The semiconductor device PM2 can selectively use these wiring sections X1 and X2 according to the selected current detection scheme.

As shown in FIG. 6 and FIG. 7, the semiconductor device PM2 incorporates a sense resistor Rs2. The sense resistor Rs2 is sealed in the mold resin body 1 and inserted in series at some midpoint of the inner lead part 133. More specifically, the sense resistor Rs2 is formed near the end 133b of the inner lead part 133. The sense resistor Rs2 is inserted in series between the die pad in the center of the inner lead part 133 and the end 133b.

This sense resistor Rs2 is a resistor used when a current sense function is used. The sense resistor Rs2 is required only to have a smaller resistance value than the shunt resistor Rsh used for detection of a main current. For this reason, even a small resistor suffices, and is therefore suitable to be sealed in the mold resin body 1 as in the case of the present embodiment.

As shown in FIG. 7, in the semiconductor device PM2, the detection terminal CIN of the integrated circuit IC1 is electrically connected to the inner lead part 31 via a bonding wire BW1. The present embodiment differs from the first embodiment in this respect.

Figure 8:
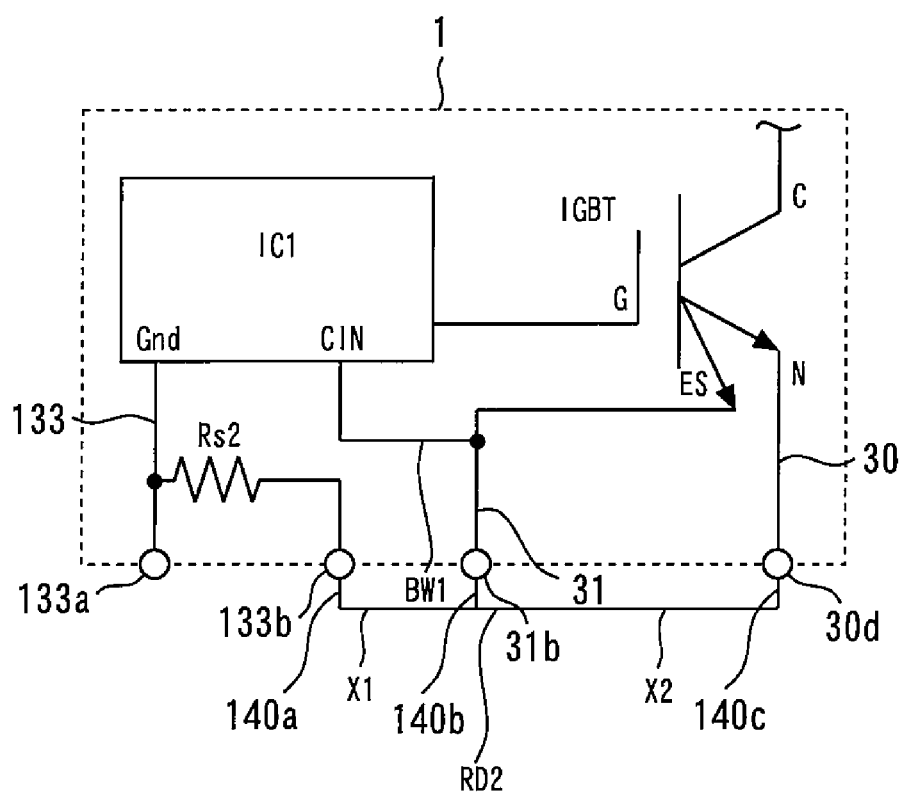

FIG. 8 is a circuit diagram illustrating the semiconductor device PM2 according to the second embodiment of the present invention. FIG. 8 illustrates part of an inner circuit of the semiconductor device PM2 shown in FIG. 6, and components assigned identical reference numerals have a one-to-one correspondence. In the stage shown in FIG. 6, the outer lead part 140 is not cut and both the wiring sections X1 and X2 remain. As will be described later, the outer lead part 140 is cut so that one of the wiring sections X1 and X2 is left depending on which of the current sense function or the main current detection function is selected.

Method of Using Apparatus of Second Embodiment (when Using Current Sense Function)

Figure 9:
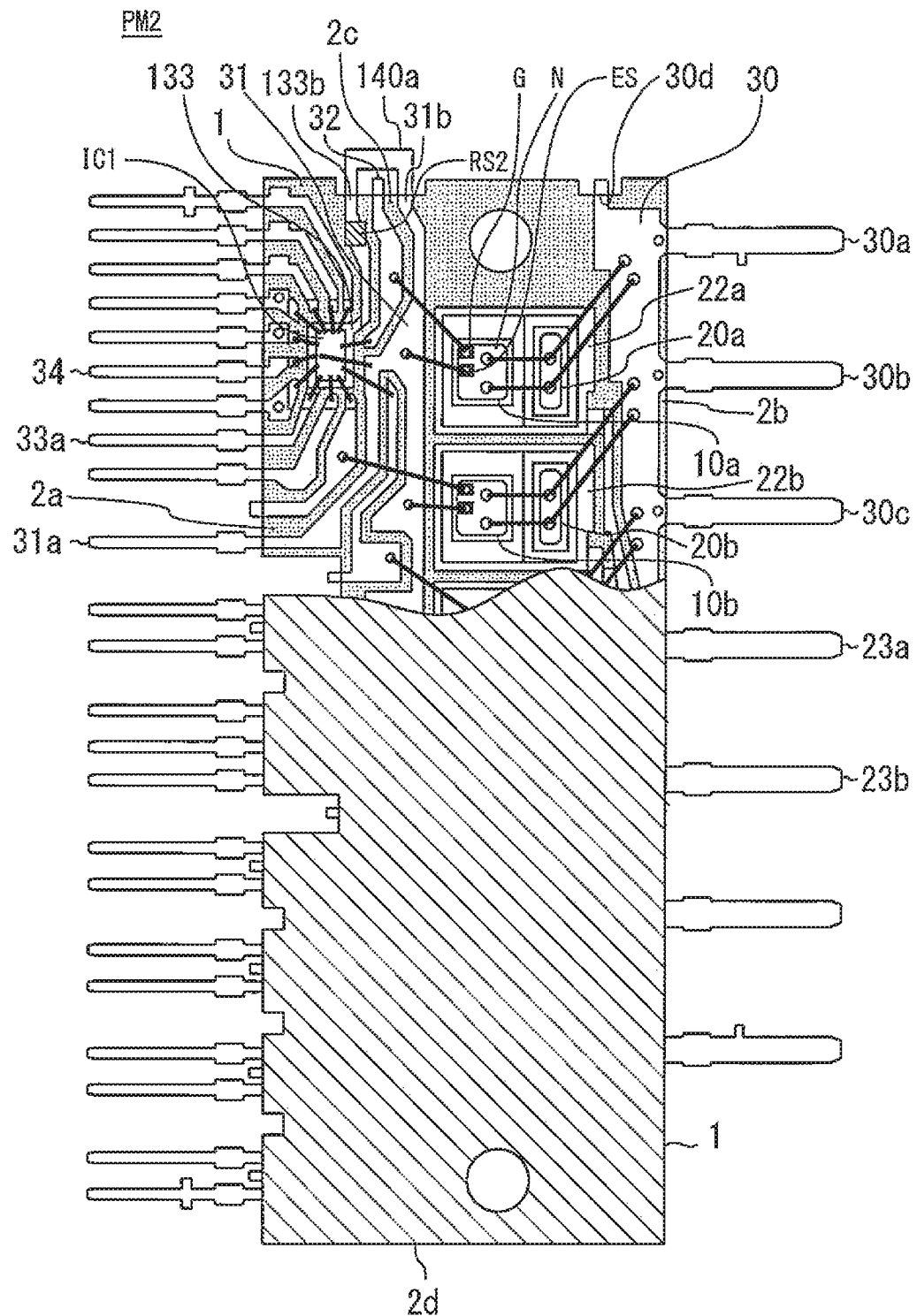
Figure 10:
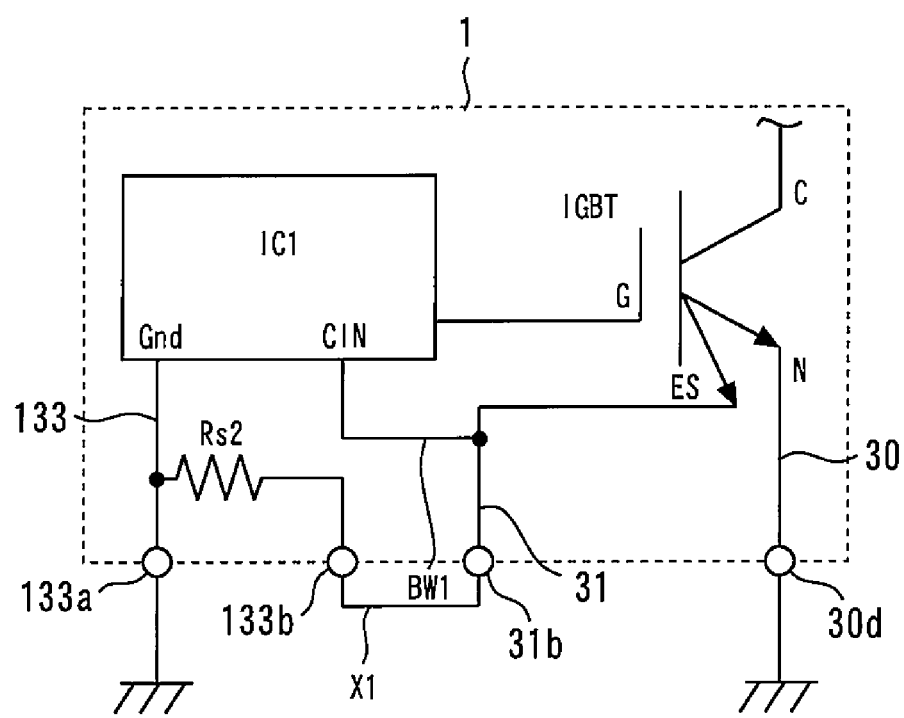

FIG. 9 and FIG. 10 illustrate the semiconductor device PM2 according to the second embodiment of the present invention and show a situation when the current sense function is used. When the current sense function is used, the wiring section X1 is used and the wiring section X2 is not used.

That is, the region connecting from the branch part 140b to the branch part 140c is cut while leaving only the region connecting from the branch part 140a to the branch part 140b of the outer lead part 140. As a result, the appearance shown in FIG. 9 is obtained. Note that the end 30d is exposed on the side 2c of the mold resin body 1.

FIG. 10 illustrates an electric circuit to be formed when the semiconductor device PM2 shown in FIG. 9 is mounted on a mounting substrate (not shown). As shown in FIG. 10, the wiring section X1 of the outer lead part 140 electrically connects a connection point between the detection terminal CIN and the emitter sense electrode ES and one end of the sense resistor Rs2. The other end of the sense resistor Rs2 is connected to the ground.

(When Main Current is Detected)

Figure 11:
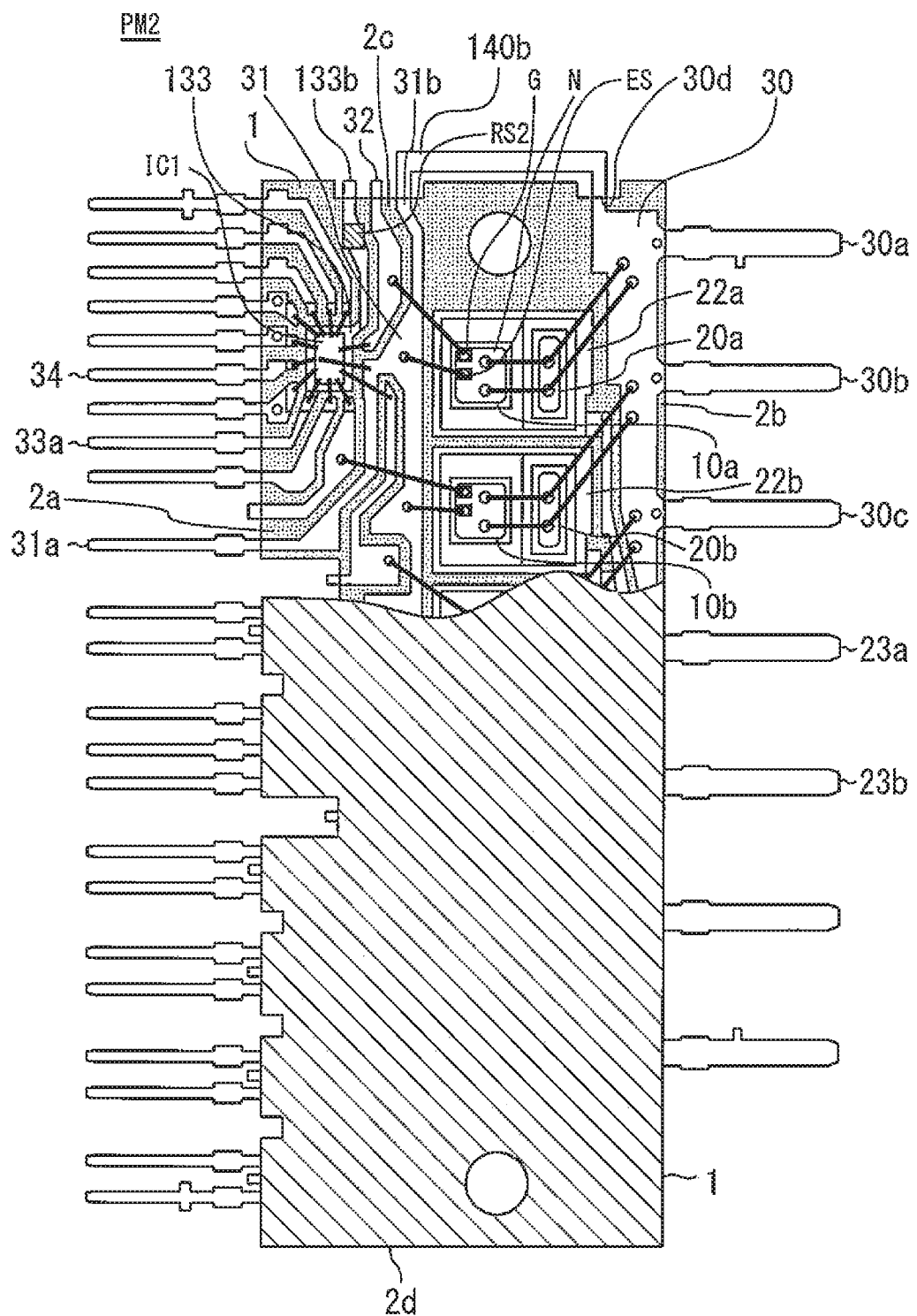
Figure 12:
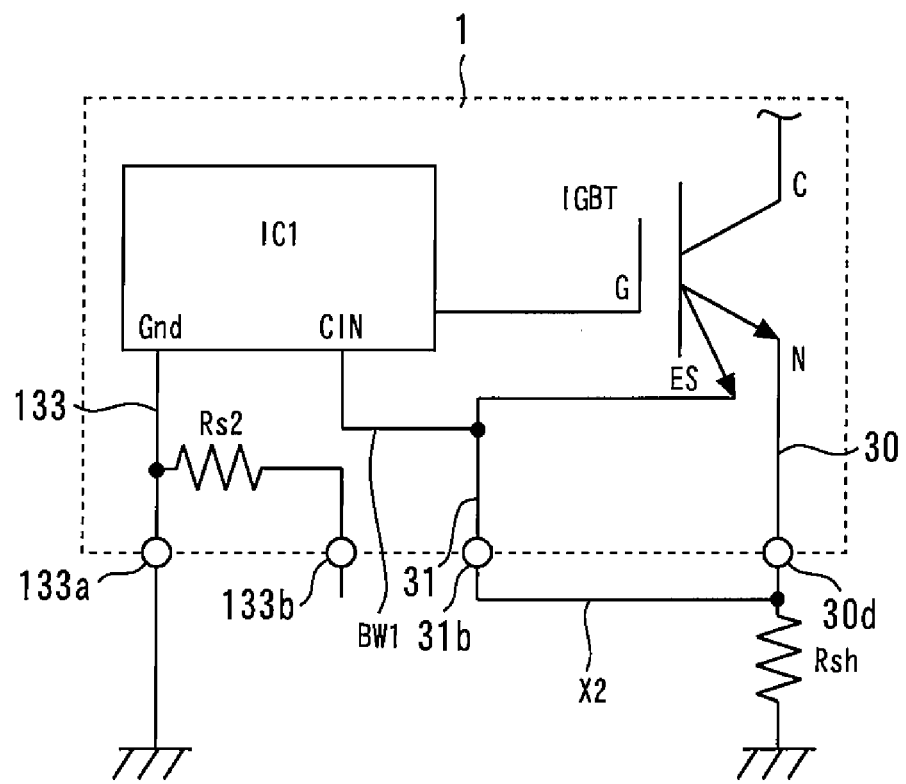

FIG. 11 and FIG. 12 illustrate the semiconductor device according to the second embodiment of the present invention and show a case where a scheme of detecting the main current is adopted. When detecting the main current, the wiring section X2 is used and the wiring section X1 is not used, which is opposite to the case where the current sense function is used.

That is, the region connecting from the branch part 140a to the branch part 140b is cut while leaving only the region connecting from the branch part 140b to the branch part 140c of the outer lead part 140. As a result, the appearance shown in FIG. 11 is obtained. Note that the end 133b is exposed on the side 2c of the mold resin body 1.

FIG. 12 illustrates an electric circuit to be formed when the semiconductor device PM2 shown in FIG. 11 is mounted on a mounting substrate (not shown). As shown in FIG. 12, the wiring section X2 of the outer lead part 140 electrically connects a connection point between the detection terminal CIN and the emitter sense electrode ES, and the emitter main electrode N. One end of the shunt resistor Rsh is connected to the wiring section X2 and the other end of the shunt resistor Rsh is connected to the ground.

As described above, according to the second embodiment, in the semiconductor device PM2 for which one of a plurality of current detection schemes is selectable, the lead RD2 that connects parts to be electrically connected required for a specific current detection scheme is formed beforehand and part thereof is exposed outside the mold resin body 1. The outer lead part 140 which is the exposed part of this lead RD2 may be left and used depending on the current detection scheme or may be cut if unnecessary. In this way, the semiconductor device PM2 capable of simplifying wiring work is provided.

In the semiconductor devices PM1 and PM2 according to the aforementioned first and second embodiments, the outer lead parts 40 and 140 may be traded after necessary cutting, or left uncut and traded. That is, according to the second embodiment, the semiconductor device PM2 after cutting the outer lead part 140 as shown in FIG. 9 and FIG. 11 can be traded. However, the present invention is not limited to this, but the semiconductor device PM2 may be traded with the outer lead part 140 left uncut as shown in FIG. 6. This is because in this case, a purchaser (user) may cut the outer lead part 140 as required.

The integrated circuit IC1 provided with the aforementioned miswiring determining function may also be applicable to other semiconductor devices without leads RD1 and RD2. This is because even with a semiconductor device provided with no leads RD1 and RD2, if the user can perform circuit wiring corresponding to the lead RD1 on the mounting substrate side, the miswiring determining function of the integrated circuit IC1 effectively functions. Therefore, only the technical concept relating to the integrated circuit IC1 provided with the miswiring determining function may be extracted from the semiconductor devices PM1 and PM2 according to the first and second embodiments and may be implemented independently.

On the contrary, only the technical concept embodied in the leads RD1 and RD2 may be implemented independently of the integrated circuit IC1 provided with the miswiring determining function. That is, in the semiconductor devices PM1 and PM2 according to the first and second embodiments, the integrated circuit IC1 may be replaced by an integrated circuit provided with no miswiring determining function.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-165997, filed on Aug. 9, 2013 including specification, claims, drawings and summary, on which the Convention priority of the present application is based, is incorporated herein by reference in its entirety.

The features and advantages of the present invention may be summarized as follows. The semiconductor devices according to the first to third aspects of the present invention allow wiring work to be simplified. The semiconductor device according to the fourth aspect of the present invention allows miswiring to be detected.

What is claimed is:

1. A semiconductor device comprising:
   a semiconductor element provided with a main electrode and a current detection electrode;
   an integrated circuit having a detection terminal;
   a mold resin body that seals the semiconductor element and the integrated circuit; and
   a lead provided with a first inner lead part electrically connected to the current detection electrode sealed in the mold resin body, a second inner lead part sealed in the mold resin body and electrically connected to the main electrode and an outer lead part connected to the first inner lead part on one side, connected to the second inner lead part on the other side and exposed outside the mold resin body.

2. The semiconductor device according to claim 1, wherein a notch extending in a lateral direction of the outer lead part is provided on a surface of the outer lead part.

3. The semiconductor device according to claim 1, wherein the integrated circuit performs alternative voltage detection on the main electrode and the current detection electrode via the detection terminal, determines, when the voltage of the detection terminal exceeds a first threshold, that an overcurrent abnormality occurs, and determines, when the voltage of the detection terminal falls below a second threshold which is smaller than the first threshold, that miswiring occurs.

4. The semiconductor device according to claim 1,
   wherein the mold resin body is provided with two opposing main surfaces and four sides connecting the two main surfaces,
   a plurality of other leads that electrically connect the semiconductor element and the integrated circuit protrude in parallel from a first side and a second side opposing the first side out of the four sides, and
   the outer lead part extends from a third side which is different from the first and second sides out of the four sides.

5. A semiconductor device comprising:
   a semiconductor element provided with a main electrode and a current detection electrode;
   an integrated circuit having a detection terminal and a reference potential terminal;
   a mold resin body that seals the semiconductor element and the integrated circuit; and
   a lead provided with a first inner lead part electrically connected to the current detection electrode sealed in the mold resin body, a second inner lead part sealed in the mold resin body and electrically connected to the reference potential terminal and an outer lead part connected to the first inner lead part on one side, connected to the second inner lead part on the other side and exposed outside the mold resin body.

6. The semiconductor device according to claim 5, further comprising a resistor sealed in the mold resin body and inserted in series in the second inner lead part.

7. The semiconductor device according to claim 5, wherein a notch extending in a lateral direction of the outer lead part is provided on a surface of the outer lead part.

8. The semiconductor device according to claim 5, wherein the integrated circuit performs alternative voltage detection on the main electrode and the current detection electrode via the detection terminal, determines, when the voltage of the detection terminal exceeds a first threshold, that an overcurrent abnormality occurs, and determines, when the voltage of the detection terminal falls below a second threshold which is smaller than the first threshold, that miswiring occurs.

9. The semiconductor device according to claim 5,
wherein the mold resin body is provided with two opposing main surfaces and four sides connecting the two main surfaces,
a plurality of other leads that electrically connect the semiconductor element and the integrated circuit protrude in parallel from a first side and a second side opposing the first side out of the four sides, and
the outer lead part extends from a third side which is different from the first and second sides out of the four sides.

10. A semiconductor device comprising:
a semiconductor element provided with a main electrode and a current detection electrode;
an integrated circuit having a detection terminal and a reference potential terminal;
a mold resin body that seals the semiconductor element and the integrated circuit; and
a lead partially sealed with the mold resin body, that electrically connects the current detection electrode, the reference potential terminal and the main electrode;
wherein the lead comprises:
a first inner lead part electrically connected to the current detection electrode sealed in the mold resin body;
a second inner lead part electrically connected to the reference potential terminal sealed in the mold resin body;
a third inner lead part sealed in the mold resin body and electrically connected to the main electrode; and
an outer lead part that has a first branch part connected to the first inner lead part, a second branch part connected to the second inner lead part and a third branch part connected to the third inner lead part, and is exposed outside the mold resin body.

11. The semiconductor device according to claim 10, further comprising a resistor sealed in the mold resin body and inserted in series in the second inner lead part.

12. The semiconductor device according to claim 10, wherein a notch extending in a lateral direction of the outer lead part is provided on a surface of the outer lead part.

13. The semiconductor device according to claim 10, wherein the integrated circuit performs alternative voltage detection on the main electrode and the current detection electrode via the detection terminal, determines, when the voltage of the detection terminal exceeds a first threshold, that an overcurrent abnormality occurs, and determines, when the voltage of the detection terminal falls below a second threshold which is smaller than the first threshold, that miswiring occurs.

14. The semiconductor device according to claim 10,
wherein the mold resin body is provided with two opposing main surfaces and four sides connecting the two main surfaces,
a plurality of other leads that electrically connect the semiconductor element and the integrated circuit protrude in parallel from a first side and a second side opposing the first side out of the four sides, and
the outer lead part extends from a third side which is different from the first and second sides out of the four sides.

15. A semiconductor device comprising:
a semiconductor element provided with a main electrode and a current detection electrode;
a main electrode terminal electrically connected to the main electrode;
a detection electrode terminal electrically connected to the current detection electrode; and
an integrated circuit having a voltage detection terminal for performing alternative voltage detection on the main electrode and the current detection electrode, that determines, when the voltage inputted to the voltage detection terminal exceeds a first threshold, that an overcurrent abnormality occurs, and determines, when the voltage inputted to the voltage detection terminal falls below a second threshold which is smaller than the first threshold, that miswiring occurs.

* * * * *